US009799577B2

(12) United States Patent
Takenaga et al.

(10) Patent No.: US 9,799,577 B2
(45) Date of Patent: Oct. 24, 2017

(54) HEAT TREATMENT SYSTEM, HEAT TREATMENT METHOD, AND PROGRAM

(71) Applicant: Tokyo Electron Limited, Tokyo (JP)

(72) Inventors: Yuichi Takenaga, Iwate (JP); Daisuke Suzuki, Yamanashi (JP); Katsuhiko Komori, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/342,242

(22) Filed: Nov. 3, 2016

(65) Prior Publication Data

US 2017/0133285 A1 May 11, 2017

(30) Foreign Application Priority Data

Nov. 6, 2015 (JP) .................................. 2015-218054

(51) Int. Cl.
*H01L 21/24* (2006.01)
*H01L 21/66* (2006.01)
*H01L 21/3215* (2006.01)
*H01L 21/324* (2006.01)
*H01L 21/67* (2006.01)

(52) U.S. Cl.
CPC ............ *H01L 22/26* (2013.01); *H01L 21/324* (2013.01); *H01L 21/32155* (2013.01); *H01L 21/67109* (2013.01); *H01L 21/67253* (2013.01)

(58) Field of Classification Search
CPC ................................ H01L 21/22; H01L 21/24
See application file for complete search history.

(56) References Cited

FOREIGN PATENT DOCUMENTS

| JP | 11-121389 A | 4/1999 |
|----|-------------|--------|
| JP | 2013-207109 A | 10/2013 |
| JP | 2013-207110 A | 10/2013 |

*Primary Examiner* — Mohammad Choudhry
(74) *Attorney, Agent, or Firm* — Abelman, Frayne & Schwab (57) ABSTRACT

A heat treatment system includes a heat treatment condition storing unit that stores a heat treatment condition with respect to a doping processing and a diffusion processing; a model storing unit that stores a model representing a relationship between a change of the heat treatment condition and a change of an impurity concentration in an impurity-doped thin film; a heat treatment unit that forms the impurity-doped thin film under the heat treatment condition; a calculating unit that calculates a heat treatment condition of the doping processing and the diffusion processing that causes the impurity concentration in the impurity-doped film to be included within the predetermined range, based on the impurity concentration in the impurity-doped thin film and the model; and an adjusting unit that adjusts the impurity concentration in the impurity-doped thin film to be included within the predetermined range.

6 Claims, 10 Drawing Sheets

| ZONE | LAYER IN FILM | TIME (min) | PRESSURE (Pa) | DOPING STEP TEMPERATURE [°C] | | | PH₃ FLOW RATE [sccm] | | | DIFFUSION STEP TEMPERATURE [°C] | | | TIME (min) |
|---|---|---|---|---|---|---|---|---|---|---|---|---|---|
| | | | | TOP | CTR | BTM | TOP | CTR | BTM | TOP | CTR | BTM | |
| TOP | SURFACE LAYER | 0.100 | 0.019 | 0.100 | 0.000 | 0.000 | 0.05 | 0.1 | 0.08 | 0.11 | 0.00 | 0.00 | 0.06 |
| | MIDDLE LAYER | 0.146 | 0.019 | 0.156 | 0.000 | 0.000 | 0.09 | 0.05 | 0.04 | -0.27 | 0.00 | 0.00 | -0.18 |
| | DEEP LAYER | 0.176 | 0.019 | 0.130 | 0.000 | 0.000 | 0.09 | 0.05 | 0.04 | 0.11 | 0.00 | 0.00 | 0.06 |
| CTR | SURFACE LAYER | 0.100 | 0.019 | 0.000 | 0.105 | 0.000 | 0 | 0.1 | 0.12 | 0.00 | 0.08 | 0.00 | 0.06 |
| | MIDDLE LAYER | 0.144 | 0.019 | 0.000 | 0.155 | 0.000 | 0 | 0.1 | 0.06 | 0.00 | -0.30 | 0.00 | -0.18 |
| | DEEP LAYER | 0.174 | 0.019 | 0.000 | 0.135 | 0.000 | 0 | 0.1 | 0.06 | 0.00 | 0.08 | 0.00 | 0.06 |
| BTM | SURFACE LAYER | 0.100 | 0.018 | 0.000 | 0.000 | 0.104 | 0 | 0 | 0.1 | 0.00 | 0.00 | 0.09 | 0.06 |
| | MIDDLE LAYER | 0.140 | 0.018 | 0.000 | 0.000 | 0.148 | 0 | 0 | 0.11 | 0.00 | 0.00 | -0.29 | -0.18 |
| | DEEP LAYER | 0.170 | 0.01 | 0.000 | 0.000 | 0.134 | 0 | 0 | 0.11 | 0.00 | 0.00 | 0.09 | 0.06 |

P CONCENTRATION IN FILM (E+20) [atoms/cm³]

|  | TARGET P CONCENTRATION [atoms/cm³] |
|---|---|
| TOP | 3.00 |
| CTR | 3.00 |
| BTM | 3.00 |

E+20 (atoms/cm³)

FIG.7A
DOPING TEMPERATURE

| TOP | 400.0 |
| CTR | 400.0 |
| BTM | 400.0 |

(°C)

FIG.7B
DOPING TIME

| 30.00 |

(min)

FIG.7C
PH₃ FLOW RATE

| TOP | 6.0 |
| CTR | 8.0 |
| BTM | 10.0 |

(sccm)

FIG.7D
DIFFUSION TEMPERATURE

| TOP | 500.0 |
| CTR | 500.0 |
| BTM | 500.0 |

(°C)

FIG.7E
DIFFUSION TIME

| 30.00 |

(min)

FIG.8

|  | TOP | CTR | BTM |
|---|---|---|---|
| SURFACE LAYER | 4.2 | 4.3 | 4.4 |
| MIDDLE LAYER | 3.3 | 3.4 | 3.5 |
| DEEP LAYER | 4.2 | 4.3 | 4.4 |

E+20 (atoms/cm$^3$)

FIG.9A
DOPING TEMPERATURE

| TOP | 399.3 |
| CTR | 397.7 |
| BTM | 397.4 |

(°C)

FIG.9B
DOPING TIME

| 31.1 |

(min)

FIG.9C
PH₃ FLOW RATE

| TOP | 5.4 |
| CTR | 8.6 |
| BTM | 10.2 |

(sccm)

FIG.9D
DIFFUSION TEMPERATURE

| TOP | 499.0 |
| CTR | 498.9 |
| BTM | 498.9 |

(°C)

FIG.9E
DIFFUSION TIME

| 27.7 |

(min)

HEAT TREATMENT SYSTEM, HEAT TREATMENT METHOD, AND PROGRAM

CROSS-REFERENCE TO RELATED APPLICATIONS

This application is based on and claims priority from Japanese Patent Application No. 2015-218054 filed on Nov. 6, 2015 with the Japan Patent Office, the disclosure of which is incorporated herein in its entirety by reference.

TECHNICAL FIELD

The present disclosure relates to a heat treatment system, a heat treatment method, and a program for heat-treating a workpiece such as, for example, a semiconductor wafer. More particularly, the present disclosure relates to a batch-type heat treatment system, a heat treatment method, and a program for collectively processing a plurality of workpieces.

BACKGROUND

In a semiconductor device manufacturing process, a batch-type heat treatment system has been used to collectively perform, for example, a film formation processing, an oxidation processing, and a diffusion processing on a plurality of workpieces such as, for example, semiconductor wafers. In the batch type heat treatment system, the semiconductor wafers may be efficiently processed. However, it is difficult to ensure uniformity of the treatment of the plurality of semiconductor wafers.

In order to solve the problem, for example, Japanese Patent Laid-Open Publication No. 11-121389 has proposed a method of providing three or more gas injectors for an upper portion, a central portion, and a lower portion to introduce a gas into a diffusion furnace and independently controlling the flow rates thereof to make the supply amount of the gas uniform, thereby enhancing the yield of semiconductor devices.

Further, Japanese Patent Laid Open Publication No. 2013-207109 has proposed a method of adjusting the heat treatment to satisfy a target heat treatment characteristic by calculating and controlling a temperature in a reaction chamber and a gas flow rate based on a heat treatment characteristic of a formed thin film, and a model representing a relationship between a change of the temperature in the reaction chamber and the gas flow rate and a change of the heat treatment characteristic.

Japanese Patent Laid Open Publication No. 2013-207110 has proposed a method of forming a laminated film of a target film thickness by calculating weighted values of respective layers from input target film thicknesses of first and second films, calculating activation energy of a laminated film based on the calculated weighted values and activation energy, preparing a model of the laminated film based on a relationship between the calculated activation energy and a temperature in each zone in the film thicknesses of the first and second films, and calculating and controlling the optimal temperature for each zone using the prepared model of the laminated film.

SUMMARY

According to a first aspect, the present disclosure provides a heat treatment system for forming an impurity-doped thin film on a workpiece by a doping processing that dopes an impurity on a thin film formed on the workpiece and a diffusion processing that diffuses the impurity-doped on the thin film. The heat treatment system includes a heat treatment condition storing unit configured to store a heat treatment condition with respect to the doping processing and the diffusion processing; a model storing unit configured to store a model that represents a relationship between a change of the heat treatment condition stored in the heat treatment condition storing unit and a change of an impurity concentration in the impurity-doped thin film; a heat treatment unit configured to form the impurity-doped thin film under the heat treatment condition stored by the heat treatment condition storing unit; a calculating unit configured to determine whether the impurity concentration in the impurity-doped thin film formed by the heat treatment unit is included within a predetermined range, and when it is determined that the impurity concentration is not included within the predetermined range, calculate a heat treatment condition of the doping processing and the diffusion processing that cause the impurity concentration to be included within the predetermined range, based on the impurity concentration in the impurity-doped thin film and the model stored by the model storing unit; and an adjusting unit configured to change the heat treatment condition stored by the heat treatment storing unit to the heat treatment condition calculated by the calculating unit, and perform the doping processing and the diffusion processing under the changed heat treatment condition, thereby adjusting the impurity concentration in the impurity-doped thin film to be included within the predetermined range.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

For example, a method of fabricating a thin film doped with an impurity such as, for example, phosphorous (P) may include a doping step of doping the impurity on the thin film and an annealing step of making the concentration of the doped impurity in the film uniform. In the fabrication method, it is necessary to determine fabrication conditions for each step. Thus, a work of uniformly adjusting the impurity concentration becomes complicated. In addition, since the fabrication conditions of the steps interfere with each other, the difficulty of the work of uniformly adjusting the impurity concentration becomes higher. Particularly, it is difficult to uniformly adjust the impurity concentration in the depth direction of the thin film.

Therefore, in the fabrication process of the thin film doped with an impurity, the adjustment of fabrication conditions has been conducted based on the experience or intuition of an operator who has wide knowledge and experience for the heat treatment system or process. Thus, there has been a demand for a heat treatment system and a heat treatment method capable of easily adjusting the fabrication conditions, for example, for a uniform impurity concentration in the film, even by an operator who lacks knowledge or experience for the heat treatment system or process.

The present disclosure has been made in consideration of the above circumstance, and an object of the present disclosure is to provide a heat treatment system, a heat treatment method, and a program capable of easily adjusting the fabrication conditions.

According to a first aspect, the present disclosure provides a heat treatment system for forming an impurity-doped thin film on a workpiece by a doping processing that dopes an impurity on a thin film formed on the workpiece and a diffusion processing that diffuses the impurity-doped on the thin film. The heat treatment system includes a heat treatment condition storing unit configured to store a heat treatment condition with respect to the doping processing and the diffusion processing; a model storing unit configured to store a model that represents a relationship between a change of the heat treatment condition stored in the heat treatment condition storing unit and a change of an impurity concentration in the impurity-doped thin film; a heat treatment unit configured to form the impurity-doped thin film under the heat treatment condition stored by the heat treatment condition storing unit; a calculating unit configured to determine whether the impurity concentration in the impurity-doped thin film formed by the heat treatment unit is included within a predetermined range, and when it is determined that the impurity concentration is not included within the predetermined range, calculate a heat treatment condition of the doping processing and the diffusion processing that causes the impurity concentration in the impurity concentration to be included within the predetermined range, based on the impurity concentration in the impurity-doped thin film and the model stored by the model storing unit; and an adjusting unit configured to change the heat treatment condition stored by the heat treatment storing unit to the heat treatment condition calculated by the calculating unit, and perform the doping processing and the diffusion processing under the changed heat treatment condition, thereby adjusting the impurity concentration in the impurity-doped thin film to be included within the predetermined range.

The heat treatment system may further include a heating unit configured to heat an inside of a processing chamber that accommodates a plurality of workpiece formed with the thin film; a plurality of gas supplying units each configured to supply a doping gas into the processing chamber; and a pressure controlling unit configured to control a pressure in the processing chamber. The model storing unit may store a model that represents a relationship between changes of a temperature in the processing chamber heated by the heating unit in the doping processing, a pressure in the processing chamber controlled by the pressure controlling unit, a flow rate of the doping gas supplied by the gas supplying unit, a time period of the doping processing, a temperature in the processing chamber heated by the heating unit in the diffusion processing, and a time period of the diffusion processing, and the change of the impurity concentration in the impurity-doped thin film. The calculating unit may calculate a temperature in the processing chamber heated by the heating unit in the doping processing, a pressure in the processing chamber controlled by the pressure controlling unit, a flow rate of the doping gas supplied by the gas supplying unit, a time period of the doping processing, a temperature in the processing chamber heated by the heating unit in the diffusion processing, and a time period of the diffusion processing, which cause the impurity concentration to be included within the predetermined range.

The processing chamber may be divided into a plurality of zones. The model stored in the model storing unit may represent a relationship between changes of a temperature in the processing chamber and a flow rate of the doping gas for each of the zones and a change of an impurity concentration in the impurity-doped thin film for each of the zones. The heating unit may set a temperature for each of the zones in the processing chamber. The gas supplying unit may set a flow rate for each of the zones in the processing chamber.

The model stored in the model storing unit is a model that represents a relationship between a change of the impurity concentration for each depth of the thin film and a change of the heat treatment condition.

According to a second aspect, the present disclosure provides a heat treatment method for forming an impurity-doped thin film on a workpiece by a doping processing that dopes an impurity on a thin film formed on the workpiece and a diffusion processing that diffuses the impurity doped on the thin film. The heat treatment method includes storing a heat treatment condition with respect to the doping processing and the diffusion processing; storing a model that represents a relationship between a change of the heat treatment condition stored in the heat treatment condition storing unit and a change of an impurity concentration in the impurity-doped thin film; forming the impurity-doped thin film under the heat treatment condition stored by the heat treatment condition storing unit; determining whether the impurity concentration in the impurity-doped thin film formed by the heat treatment unit is included within a predetermined range, and when it is determined that the impurity concentration is not included within the predetermined range, calculating a heat treatment condition of the doping processing and the diffusion processing that causes the impurity concentration in the impurity-doped film to be included within the predetermined range, based on the impurity concentration in the impurity-doped thin film and the model stored by the model storing unit; and adjusting the impurity concentration in the impurity-doped thin film to be included within the predetermined range by changing the heat treatment condition stored by the heat treatment storing unit to the heat treatment condition calculated by the calculating unit, and performing the doping processing and the diffusion processing under the changed heat treatment condition.

According to a third aspect, the present disclosure provides a non-transitory computer-readable storage medium that stores a program for forming an impurity-doped thin film on a workpiece by a doping processing that dopes an impurity on a thin film formed on the workpiece and a diffusion processing that diffuses the impurity doped on the thin film, which, when executed, causes a computer to function as: a heat treatment condition storing unit configured to store a heat treatment condition with respect to the doping processing and the diffusion processing; a model storing unit configured to store a model that represents a relationship between a change of the heat treatment condition stored in the heat treatment condition storing unit and a change of an impurity concentration in the impurity-doped thin film; a heat treatment unit configured to form the impurity-doped thin film under the heat treatment condition stored by the heat treatment condition storing unit; a calculating unit configured to determine whether the impurity concentration in the impurity-doped thin film formed by the heat treatment unit is included within a predetermined range, and when it is determined that the impurity concentration is not included within the predetermined range, calculate a heat treatment condition of the doping processing and the diffusion processing that causes the impurity concentration in the impurity-doped film to be included within the predetermined range, based on the impurity concentration in the impurity-doped thin film and the model stored by the model storing unit; and an adjusting unit configured to change the heat treatment condition stored by the heat treatment storing unit to the heat treatment condition calculated by the calculating unit, and perform the doping processing and the diffusion processing under the changed heat treatment condition, thereby adjusting the impurity concentration in the impurity-doped thin film to be included within the predetermined range.

According to the present disclosure, it is possible to provide a heat treatment system, a heat treatment method, and a program capable of easily adjusting the fabrication condition.

Hereinafter, an exemplary embodiment of the present disclosure will be described with respect to a case where the heat treatment apparatus, the heat treatment method, and the program of the present invention are applied to a batch type vertical heat treatment apparatus 1 illustrated in FIG. 1. In addition, the present exemplary embodiment will be described with respect to a case where $PH_3$ gas is used as a doping gas in a polysilicon (POLY) thin film formed on a workpiece to form a phosphorous-doped polysilicon film (POLY film) having a uniform phosphorous (P) concentration in the film.

Figure 1:
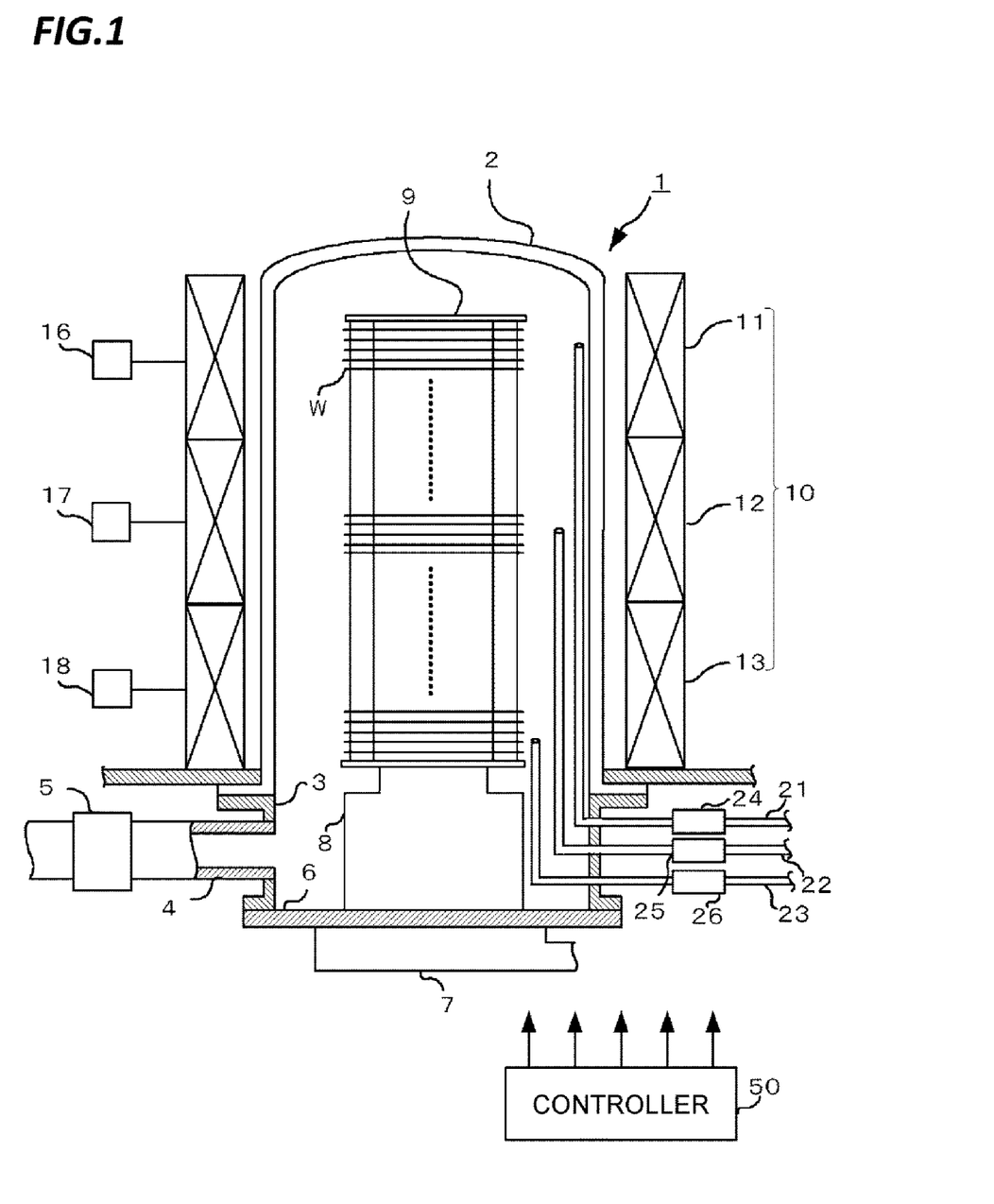
FIG. 1 is a view illustrating a structure of a heat treatment apparatus according to an exemplary embodiment of the present disclosure.

As illustrated in FIG. 1, the heat treatment apparatus 1 of the present exemplary embodiment includes a substantially cylindrical reaction tube 2 having a ceiling. The reaction tube 2 is arranged such that its longitudinal direction is directed in the vertical direction. The reaction tube 2 is formed of a material that is excellent in heat resistance and corrosion resistance, for example, quartz.

A substantially cylindrical manifold 3 is provided at a lower side of the reaction tube 2. The upper end of the manifold 3 is hermetically joined to the lower end of the reaction tube 2. The manifold 3 is hermetically connected to an exhaust pipe 4 to exhaust a gas inside the reaction tube 2. The exhaust pipe 4 is provided with a pressure adjusting unit 5 including, for example, a valve or a vacuum pump, and adjusts the inside of the reaction tube 2 to a desired pressure (degree of vacuum).

A cover 6 is provided at a lower side of the reaction tube 3 (reaction tube 2). The cover 6 is configured to be movable up and down by a boat elevator 7. Thus, the cover 6 is disposed such that, when the cover 6 is moved up by the boat elevator 7, the lower side (furnace opening portion) of the manifold 3 (reaction tube 2) is closed, and when the cover 6 is moved down by the boat elevator 7, the lower side (furnace opening portion) of the manifold 3 (reaction tube 2) is opened.

A wafer boat 9 is provided above the cover 6 via a heat insulating cylinder (heat insulator) 8. The wafer boat 9 is a wafer holder that accommodates (holds) a workpiece, for example, a semiconductor wafer W. In the present exemplary embodiment, the wafer boat 9 is configured to accommodate a plurality (e.g., 150 sheets) of semiconductor wafers W at predetermined intervals in the vertical direction. Then, the semiconductor wafers W are accommodated in the wafer boat 9, and the cover 9 is moved up by the boat elevator 7, so that the semiconductor wafers W are loaded into the reaction tube 2.

Figure 3:
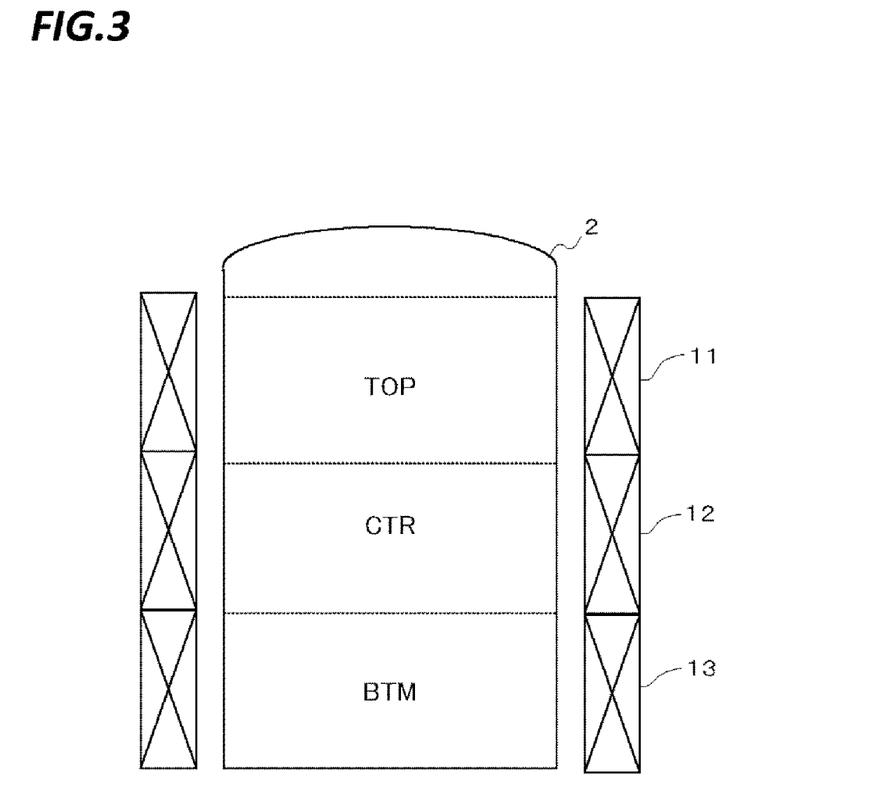
FIG. 3 is a view illustrating zones within a reaction tube.

A heater unit 10 including, for example, resistance heating elements is provided around the reaction tube 2 to surround the reaction tube 2. The inside of the reaction tube 2 is heated to a predetermined temperature by the heater unit 10. As a result, the semiconductor wafers W are heated to a predetermined temperature. The heater unit 10 is constituted with, for example, heaters 11 to 13 arranged in three tiers. The heaters 11 to 13 are connected to heater controllers 16 to 18, respectively. Therefore, since power is independently supplied to the respective power controllers 16 to 18, the respective heaters 11 to 13 may be independently heated to a desired temperature. As described above, the inside of the reaction tube 2 is divided into three zones by the heaters 11 to 13 as illustrated in FIG. 3. For example, when the top (TOP ZONE) in the reaction tube 2 is heated, the power controller 16 is controlled to heat the heater 11 to a desired temperature. When the center (CTR ZONE) in the reaction tube 2 is heated, the power controller 17 is controlled to heat the heater 12 to a desired temperature. When the bottom (BTM ZONE) in the reaction tube 2 is heated, the power controller 18 is controlled to heat the heater 13 to a desired temperature.

Further, the manifold 3 is provided with a plurality of processing gas supply pipes to supply a processing gas into the reaction tube 2. In the present exemplary embodiment, the processing gas supplied from the processing gas supply pipes is $PH_3$ gas serving as a doping gas. FIG. 1 illustrates three (3) $PH_3$ supply pipes 21 to 23 to supply the $PH_3$ gas to the manifold 3.

The $PH_3$ gas supply pipe 21 is formed to extend from the side of the manifold 3 to the vicinity of the top of the wafer boat 9 (TOP). The $PH_3$ gas supply pipe 22 is formed to extend from the side of the manifold 3 to the vicinity of the center of the wafer boat 9 (CTR). The $PH_3$ gas supply pipe 23 is formed to extend from the side of the manifold 3 to the vicinity of the bottom of the wafer boat 9 (BTM). Thus, when $PH_3$ gas is supplied from the TOP (ZONE) in the reaction tube 2, the $PH_3$ is supplied into the reaction tube 2 through the $PH_3$ gas supply pipe 21. When $PH_3$ gas is supplied from the CRT (ZONE) in the reaction tube 2, the $PH_3$ is supplied into the reaction tube 2 through the PH3 gas supply pipe 22. When $PH_3$ gas is supplied from the BTM (ZONE) in the reaction tube 2, the $PH_3$ is supplied into the reaction tube 2 through the $PH_3$ gas supply pipe 23.

The PH$_3$ gas supply pipes 21 to 23 are provided with flow rate adjusting units 24 to 26, respectively. Each of the flow rate adjusting units 24 to 26 is constituted with, for example, a mass flow controller (MFC) to adjust the flow rate of the PH$_3$ gas flowing through the PH$_3$ gas supply pipes 21 to 23. Thus, the PH$_3$ gas supplied from each of the PH$_3$ gas supply pipes 21 to 23 is adjusted to a desired flow rate by each of the flow rate adjusting units 24 to 26, and then, supplied into the reaction tube 2.

Figure 2:
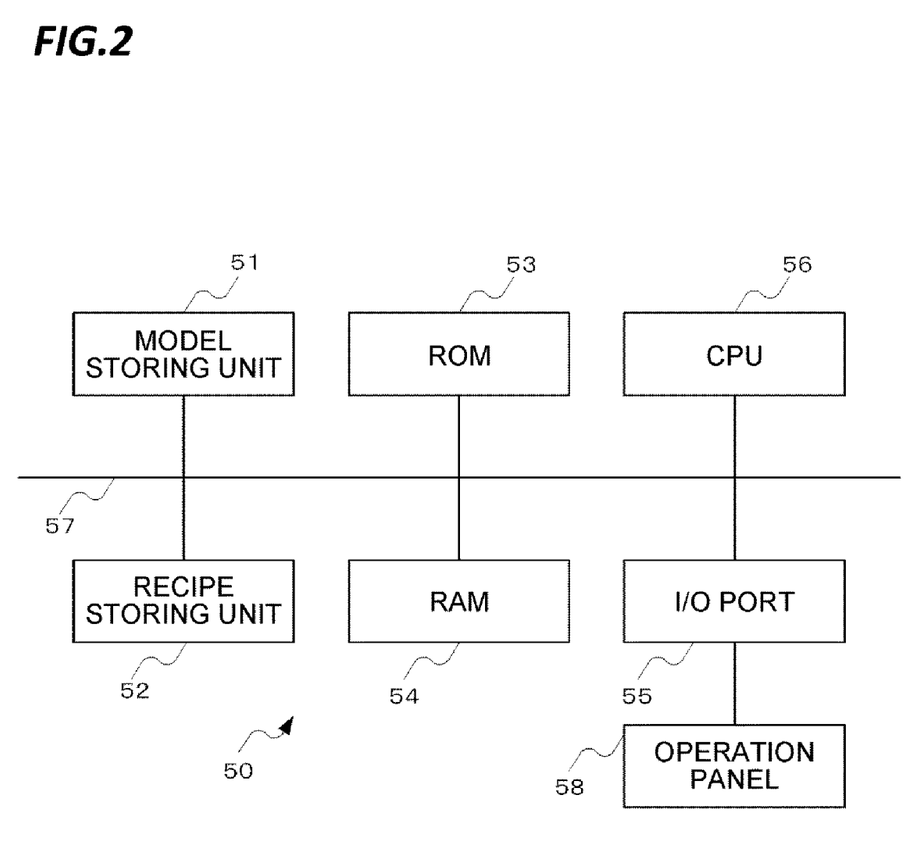
FIG. 2 is a view illustrating an exemplary configuration of the controller in FIG. 1.

Further, the heat treatment apparatus 1 includes a controller 50 configured to control processing parameters such as, for example, a gas flow rate, pressure, and temperature of the processing atmosphere in the reaction tube 2. The controller 50 outputs a control signal to, for example, the flow rate adjusting units 24 to 26, the pressure adjusting unit 5, or the power controllers 16 to 18 of the heaters 11 to 13. FIG. 2 illustrates the configuration of the controller 50.

As illustrated in FIG. 2, the controller 50 includes a model storing unit 51, a recipe storing unit 52, a read only memory (ROM) 53, a random access memory (RAM) 54, an input/output (I/O) port 55, a central processing unit 56, and a bus 57 that connects these components with each other.

The model storing unit 51 stores a model representing a relationship of the changes in time, pressure, temperature (TOP, CTR, and BTM), and flow rate (TOP, CTR, BTM) of the gas (PH$_3$) in the doping step, and temperature (TOP, CTR, and BTM) and time in the annealing (diffusion) step, with the P concentration in the POLY film (a surface layer, a middle layer, and a deep layer). This model will be described in detail later.

The recipe storing unit 52 stores a process recipe that determines a control procedure depending on the kind of the film formation processing to be performed in the heat treatment apparatus 1. The process recipe is a recipe prepared for every processing (process) actually performed by a user, and defines the temperature change of each unit, the pressure change within the reaction tube 2, the timings of the start of the supply of the gas and the stop of the supply, and the supply amount, from the loading of the semiconductor wafers W onto the reaction tube 2 to the unloading of the processed semiconductor wafers therefrom.

The ROM 53 is a storage medium that is constituted by, for example, an electrically erasable programmable read-only memory (EEPROM), a flash memory, or a hard disk, and stores an operation program of the CPU 56. The RAM 54 functions as a work area of the CPU 56.

The I/O port 55 supplies a measurement signal for the temperature, the pressure, or the gas flow rate, and outputs a control signal output by the CPU 56 to the respective units (e.g., the pressure adjusting unit 5, the heater controllers 16 to 18 of the heaters 11 to 13, and the flow rate controlling units 24 to 26). Further, the I/O port 55 is connected with an operation panel 58 with which an operator operates the heat treatment apparatus 1.

The CPU 56 constitutes the core of the controller 50. The CPU 56 executes the operation program stored in the ROM 53, and according to the instructions from the operation panel 58, controls the operations of the heat treatment apparatus 1 along the process recipe stored in the recipe storing unit 52.

Further, the CPU 56 calculates fabrication conditions of the doping step and the diffusion step based on the model stored in the model storing unit 51 and the P concentration in the thin film measured for each zone. In addition, the CPU 56 updates the corresponding fabrication conditions of the doping step and the diffusion step stored in the recipe storing unit 52 with the calculated fabrication conditions of the doping step and the diffusion step. Then, the CPU 56 outputs a control signal to, for example, the power controllers so as to satisfy the updated fabrication conditions of the doping step and the diffusion step. The bus 57 transmits information between the respective units.

Figure 4:
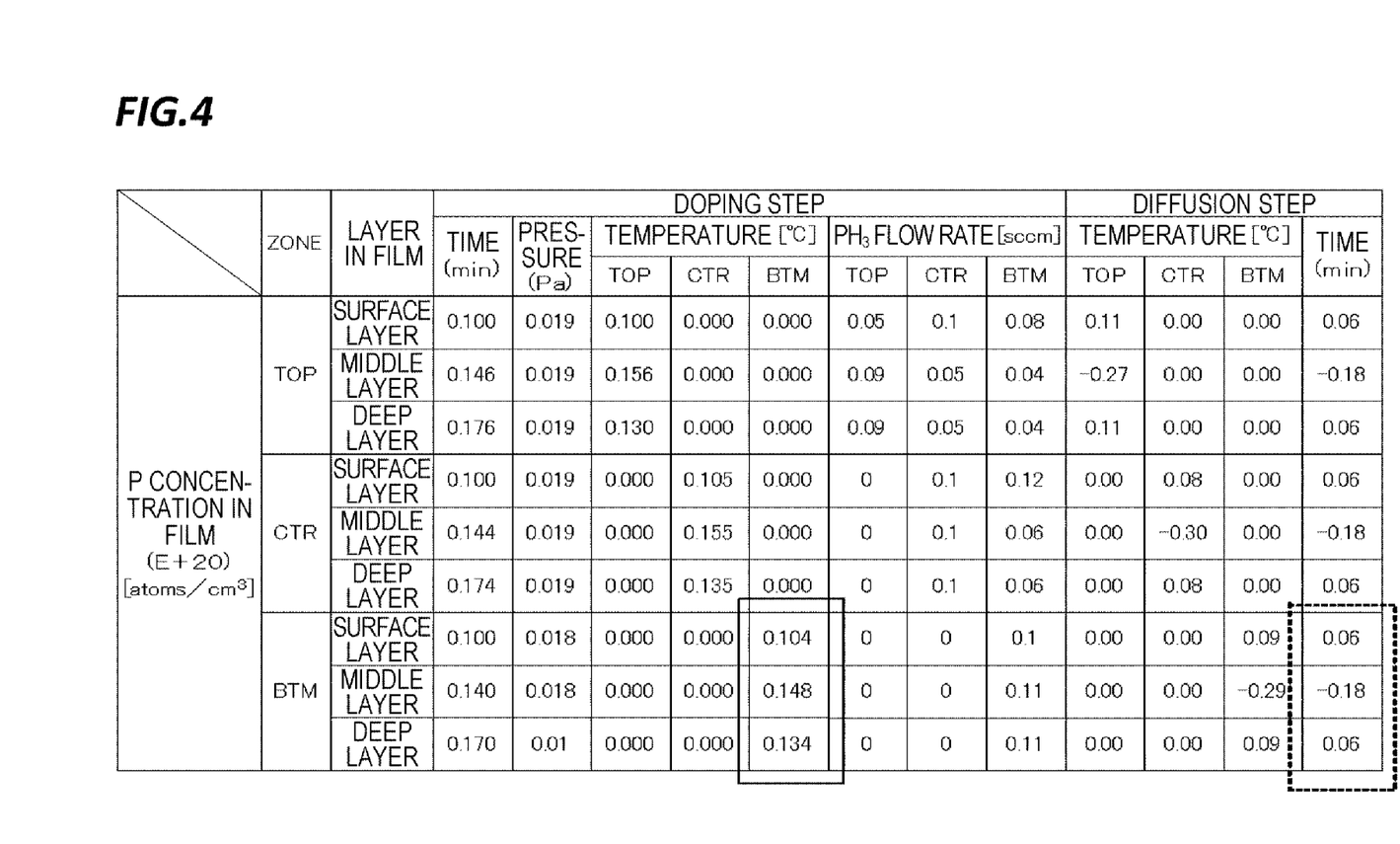
FIG. 4 is a view illustrating a relationship among a change of fabrication conditions in a doping step and a diffusion step and a change of a temperature or a flow rate of $PH_3$ in a predetermined zone, and a P concentration in a film formed in each zone.

Next, the model stored in the model storing unit 51 will be described. As described above, the model storing unit 51 stores a model representing a relationship of the changes in time, pressure, temperature (TOP, CTR, and BTM), and flow rate (TOP, CTR, BTM) of the gas (PH$_3$) in the doping step, and temperature (TOP, CTR, and BTM) and time in the annealing (diffusion) step, with the P concentration in the POLY film (a surface layer, a middle layer, and a deep layer). FIG. 4 illustrates an exemplary model.

As illustrated in FIG. 4, the model shows how much the P concentration in the film varies in three sites which are different in depth of the POLY film (the surface layer, the middle layer, and the deep layer) for every zone (including TOP, CTR, and BTM), when the processing time, the pressure, and the temperature of a predetermined zone, and the flow rate of PH$_3$ in the doping step are increased by 1 minute, 1 Pa, 1° C., and 1 sccm, respectively, and the temperature of a predetermined zone and the processing time in the diffusion step are increased by 1° C. and 1 minute, respectively.

For example, the section surrounded by the solid line in FIG. 4 shows that, when the power controller 18 is controlled to heat the heater 13 such that the temperature set value of the BTM zone is increased by 1° C. in the doping step, the P concentration of the surface layer of the POLY film in the BTM zone is increased by 0.104 (E+20) atoms/cm$^3$, the P concentration of the middle layer is increased by 0.148 (E+20) atoms/cm$^3$, and the P concentration of the deep layer is increased by 0.134 (E+20) atoms/cm$^3$.

Further, the section surrounded by the dotted line in FIG. 4 shows that, when the processing time of the diffusion step is increased by 1 minute, the P concentration of the surface layer of the POLY film in the BTM zone is increased by 0.06 (E+20) atoms/cm$^3$, the P concentration of the middle layer is decreased by 0.18 (E+20) atoms/cm$^3$, and the P concentration of the deep layer is increased by 0.06 (E+20) atoms/cm$^3$.

With the model, the fabrication conditions of the doping step and the diffusion step in which the concentration of P doped to and diffused in the POLY film becomes uniform is calculated and adjusted using an optimization algorithm, for each zone and each depth. The model may show how much the P concentration in the POLY film (the surface layer, the middle layer, and the deep layer) in each zone varies when the fabrication conditions of the doping step and the diffusion step are changed, and, in addition to this, various other models may be used.

Further, in the models, since a non-optimal numerical value of the default is also considered depending on the state of the equipment, the learning of the models may be performed by loading a learning function by adding, for example, an expansion Kalman filter to software. As for the learning function by the expansion Kalman filter, a method disclosed in, for example, U.S. Pat. No. 5,991,525 may be used.

Figure 5:
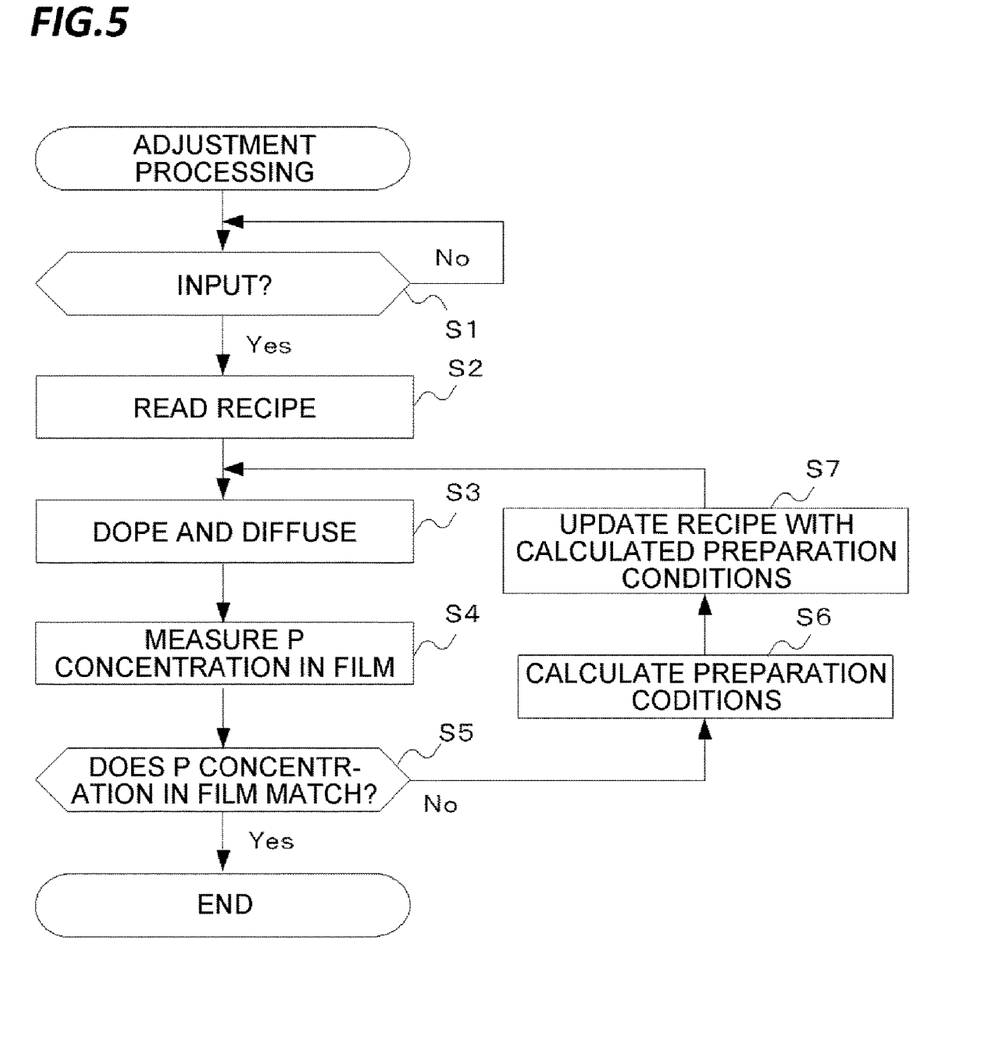
FIG. 5 is a flowchart for explaining an adjustment processing.

Next, descriptions will be made on an adjustment method (adjustment processing) of adjusting the P concentration in the POLY film using the heat treatment apparatus 1 configured as described above. In the present exemplary embodiment, descriptions will be made on a case where phosphorous (P) is doped to and diffused in the POLY film, and the P concentration in each zone and each depth of the formed POLY film is uniformly adjusted. FIG. 5 is a flowchart for explaining an adjustment processing of the present exemplary embodiment.

Figure 6:
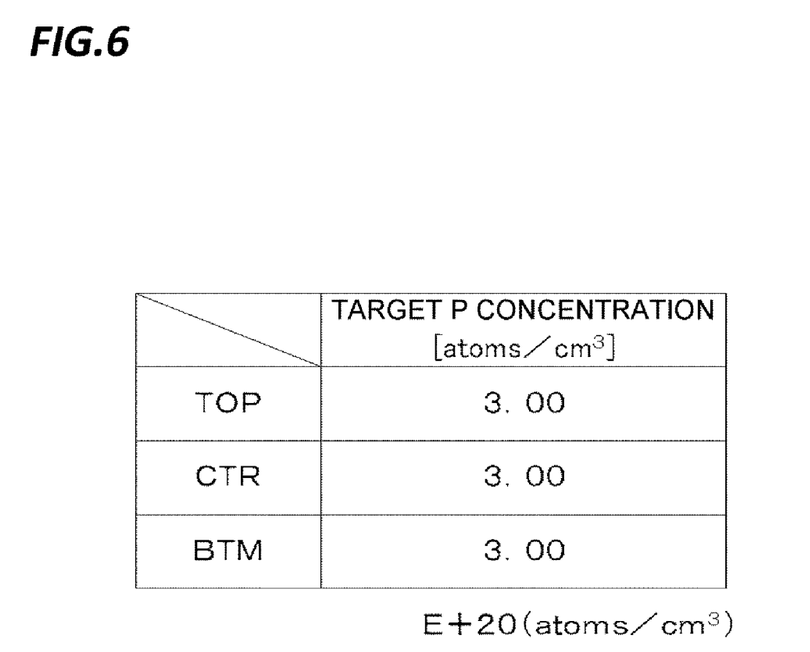
FIG. 6 is a view illustrating a P concentration in a POLY film input by an operator.
Figures 7A, 7B:
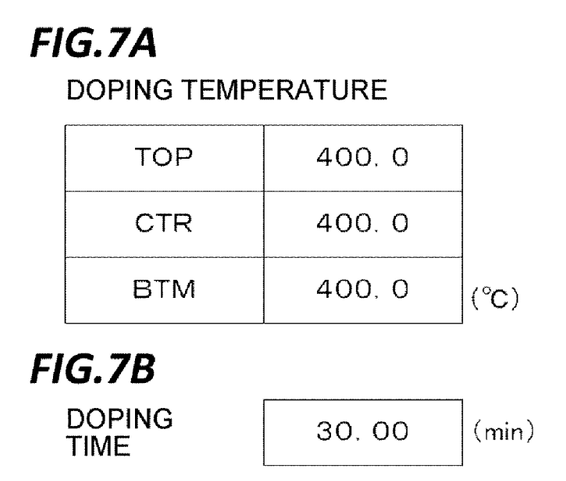
FIGS. 7A to 7E are views illustrating exemplary process recipes.
Figure 7C:
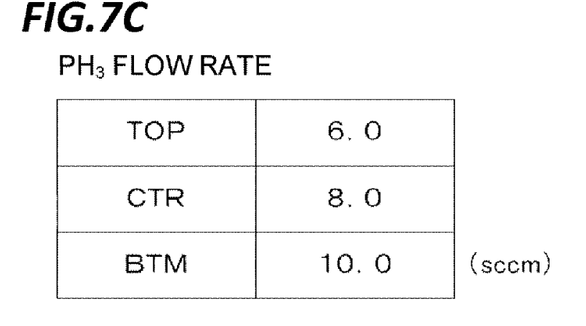
Figure 7D:
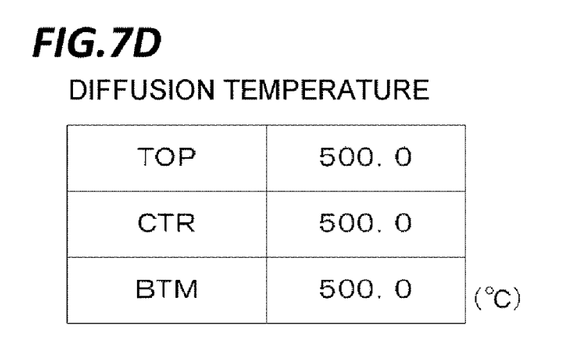
Figure 7E:
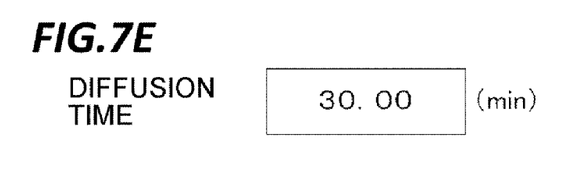

In the adjustment processing, an operator operates the operation panel 58 to select a process type (in this exemplary embodiment, a film formation of a phosphorous-doped film using $PH_3$ gas), and input a target P concentration in the POLY film for each zone, as illustrated in FIG. 6.

The controller 50 (CPU 56) determines whether the required information (e.g., the process type) is input (step S1). When it is determined that the required information is input (step S1; Yes), the CPU 56 reads a process recipe corresponding to the input process type, from the process recipe storing unit 52 (step S2). The process recipe stores fabrication conditions such as, for example, the pressure, the temperature, and the flow rate of $PH_3$ gas in the reaction tube 2. In the process recipe, for example, as illustrated in FIGS. 7A to 7E, the temperature of the doping step (FIG. 7A), the time (FIG. 7B), the flow rate of $PH_3$ gas (FIG. 7C), the temperature of the diffusion step (FIG. 7D), and the diffusion time (FIG. 7E) are stored for each zone in the reaction tube 2.

Next, the CPU 56 causes the boat elevator 7 (cover 6) to be moved down so that the wafer boat 9 equipped with at least a semiconductor wafer W (monitor wafer) in each ZONE is disposed on the cover 6. Subsequently, the CPU 56 causes the boat elevator 7 (cover 6) to be moved up so that the wafer boat 9 (monitor wafer) is loaded into the reaction tube 2. Then, the CPU 56 controls the pressure adjusting unit 5, the power controllers 16 to 18 of the heaters 11 to 13, and the flow rate controlling units 24 to 26 along the recipe read from the recipe storing unit 52, to dope and diffuse the phosphorous (P) to the POLY film formed on the monitor wafer (step S3).

Figure 8:
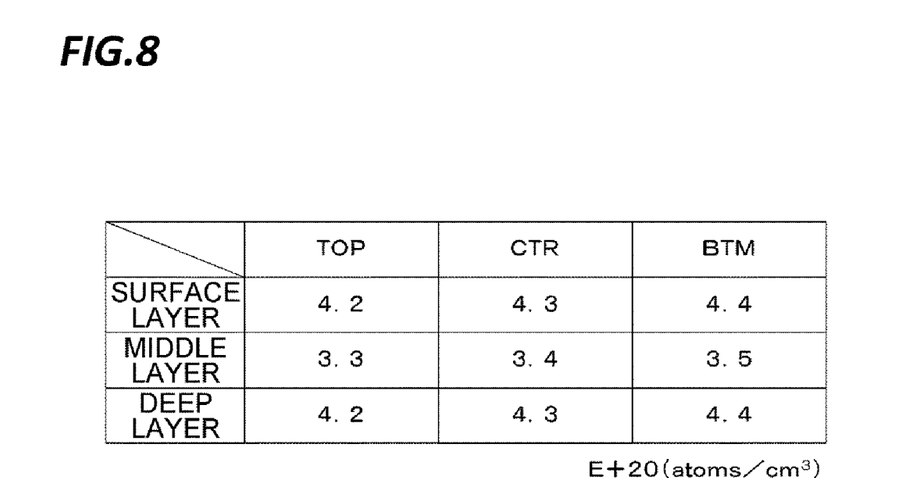
FIG. 8 is a view illustrating a measured P concentration in the POLY film.
Figures 9A, 9B:
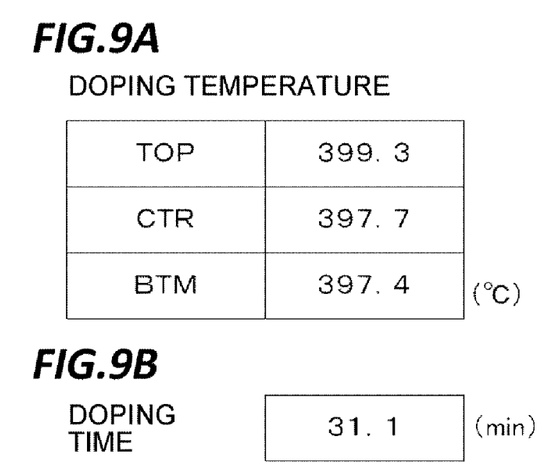
FIGS. 9A to 9E are views illustrating calculated temperature, time, and flow rate.
Figure 9C:
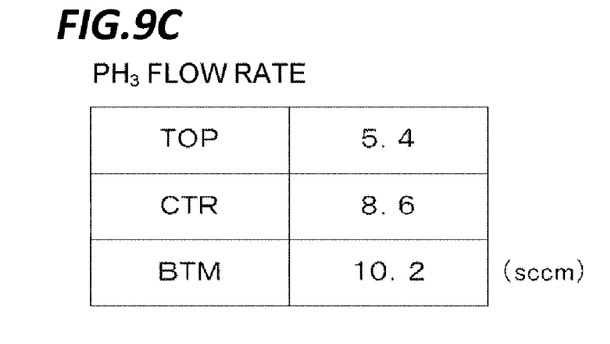
Figure 9D:
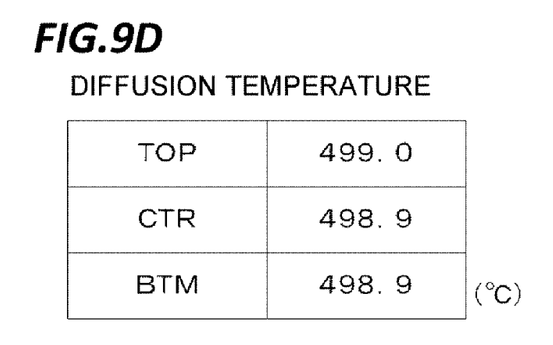
Figure 9E:
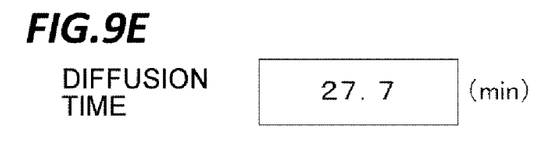

When the doping and diffusion processing is completed, the CPU 56 causes the boat elevator 7 (cover 6) to be moved down so that the monitor wafer having the phosphorous-doped POLY film is unloaded, and the monitor wafer is conveyed to, for example, a measurement device (not illustrated), thereby measuring the P concentration in the POLY film (step S4). In the measurement device, when the P concentration in the POLY film is measured, the measured data for the P concentration in the POLY film, for example, as illustrated in FIG. 8 is transmitted to the heat treatment apparatus 1 (CPU 56). Alternatively, the operator may operate the operation panel 58 to input the measurement result.

When the measured data for the P concentration in the POLY film is received, the CPU 56 determines whether the received data for the P concentration matches the input P concentration in the POLY film (step S5). Alternately, the operator may determine whether the measured data matches the P concentration in the POLY film, and operate the operation panel 58 to input the result.

When it is determined that both do not match each other (step S5; No), the CPU 6 calculates (adjusts) the fabrication conditions (for example, the temperature, the time, and the flow rate of $PH_3$ gas in the doping step, and the temperature and the time in the diffusion step) (step S6).

In the calculation of numerical values of the fabrication conditions, for example, a temperature and a flow rate of $PH_3$, which are expected to bring a target P concentration in the film, are calculated using an optimization algorithm from the model representing the relationship of the changes in the time, the pressure, the temperature, and the flow rate of $PH_3$ in the doping step, and the temperature and the time in the diffusion step with the P concentration in the POLY film (the surface layer, the middle layer, and the deep layer), for example, as illustrated in FIG. 4. For example, in the case of the measurement result illustrated in FIG. 8, the temperature, the time, and the flow rate of $PH_3$ gas in the doping step, and the temperature and the time in the diffusion step are calculated as the values illustrated in FIGS. 9A to 9E, respectively.

Figure 10A:
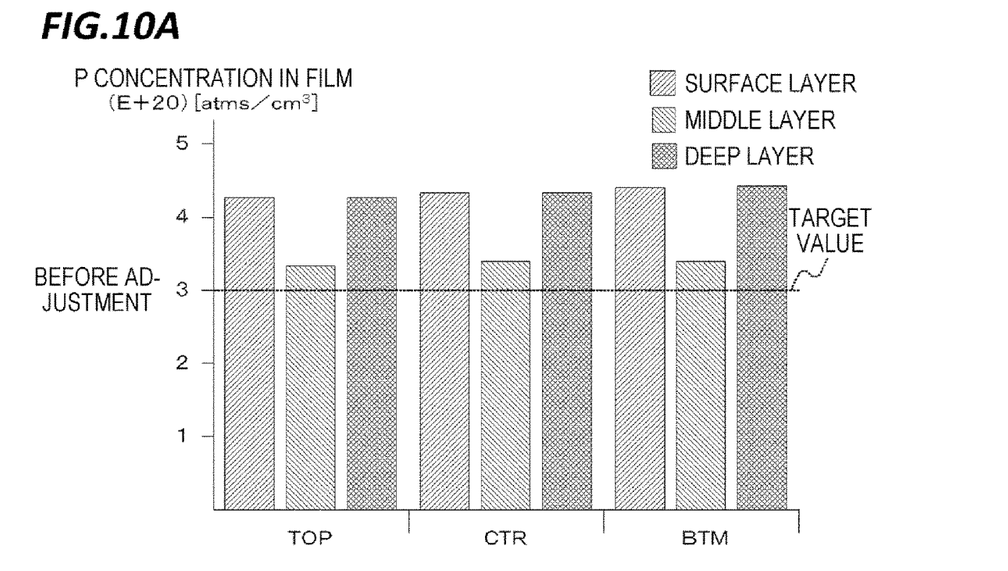
FIGS. 10A and B are views illustrating a P concentration in the POLY film before and after the adjustment.
Figure 10B:
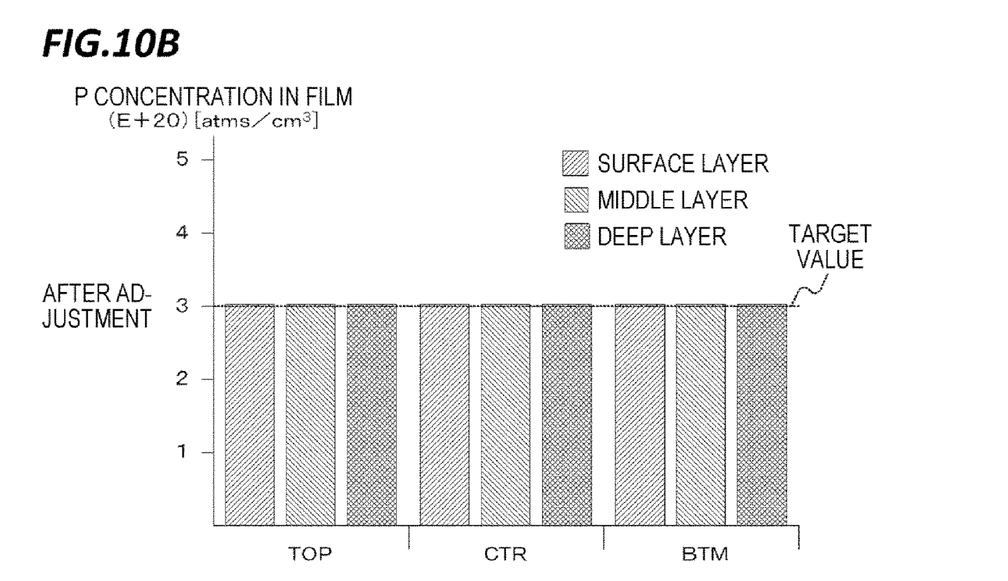

Subsequently, the CPU 56 updates the fabrication conditions of the read recipe with the calculated fabrication conditions (including the temperature, the time, and the flow rate of $PH_3$ in the doping step, and the temperature and the time in the diffusion step) (step S7), and then, executes steps S3 to S5 again. That is, the CPU 56 controls the power controllers 16 to 18 such that, with respect to the temperature in the reaction tube 2 in the doping step, the temperature of the heater 11 is 399.3° C., the temperature of the heater 12 is 397.7° C., and the temperature of the heater 13 is 397.4° C., and the doping time is 31.1 min. Further, the CPU 56 controls the flow rate adjusting units 24 to 26 such that $PH_3$ gas is supplied at 5.4 sccm from the $PH_3$ gas supply pipe 21, 8.6 sccm from the $PH_3$ gas supply pipe 22, and 10.2 sccm from the $PH_3$ gas supply pipe 23. Further, the CPU 56 controls the power controllers 16 to 18 such that, with respect to the temperature in the reaction tube 2 in the diffusion step, the temperature of the heater 11 is 499.0° C., the temperature of the heater 12 is 498.9° C., and the temperature of the heater 13 is 498.9° C., and the diffusion time is 27.7 min. Then, the CPU 56 dopes and diffuses phosphorous (P) to the POLY film of the monitor wafer (step S3), causes a measurement device (not illustrated) to measure the P concentration in the POLY film (step S4), and then, determines whether the measured P concentration in the POLY film matches the input P concentration in the POLY film (step S5). In the case of the present exemplary embodiment, the measured P concentration in the POLY film and the input P concentration in the POLY film match each other, as illustrated in FIG. 10B. Accordingly, the fabrication condition may be easily adjusted such that the P concentration in the POLY film becomes uniform, even by an operator who lacks knowledge or experience for the heat treatment system or process. When it is determined that both do not match each other (step S5; No), the CPU 56 executes steps S6, S7, and S3 to S5 again.

And, when it is determined that both match each other (step S5; Yes), the CPU 56 terminates the processing.

As described above, according to the present exemplary embodiment, the fabrication condition may be easily adjusted such that the P concentration in the POLY film becomes uniform merely by inputting the process type and a target P concentration in the POLY film to be targeted. Accordingly, the fabrication condition may be easily adjusted such that the P concentration in the POLY film becomes uniform, even by an operator who lacks knowledge or experience for the heat treatment system or process.

Further, the present disclosure is not limited to the above-described exemplary embodiment, and various modifications and applications may be made thereto. Hereinafter, descriptions will be made on other exemplary embodiments that are applicable to the present disclosure.

In the above-described exemplary embodiment, the present disclosure has been described with respect to the case where the measured P concentration in the POLY film is matched with the target P concentration in the POLY film. However, for example, an allowable range, for example, a range of about ±1% may be set for the target P concentration in the POLY film, and when the measured P concentration in the POLY film is included within the range, the adjustment processing may be terminated.

In the above-described exemplary embodiment, the present disclosure has been described with respect to the case where $PH_3$ gas is used as a doping gas to form a phosphorous-doped polysilicon film (POLY film). However, the impurity to be doped is not limited to phosphorous, but may be, for example, boron (B), carbon (C), or arsenic (As). In addition, the thin film to be formed is not limited to the polysilicon film, but the present disclosure may be applied to formation of various films such as, for example, an amorphous silicon film (a-Si film), an epitaxial Si film (Epi-Si film), a germanium film (Ge film), or a silicon germanium film (SiGe film).

Further, the P concentration in the film may be adjusted by using a plurality of impurity-added gases having a different impurity concentration (e.g., 1% $PH_3$ gas and 10% $PH_3$ gas) and converting them.

In the above-described exemplary embodiment, the present disclosure has been described with respect to the case where three (3) $PH_3$ gas supply pipes are provided in the heat treatment apparatus 1. However, the number of the $PH_3$ gas supply pipes may be two, or four or more, or arbitrarily set. Further, the number of tiers of the heaters (the number of zones), or the number of monitor wafers extracted from each zone may be arbitrarily set.

In the above-described exemplary embodiment, the present disclosure has been described with respect to the case of the batch type heat treatment apparatus having a single tube structure. However, the present disclosure may also be applied to a batch type vertical heat treatment apparatus having a double tube structure in which the reaction tube 2 is constituted by an inner tube and an outer tube. Further, the present disclosure is not limited to the processing of semiconductor wafers, but is also applicable to a processing of, for example, flat panel display (FPD) substrates, glass substrates, or plasma display panel (PDP) substrates.

The controller 50 related to the exemplary embodiment of the present invention may be realized using a general computer system without a dedicated system. For example, the controller 50, which executes the processing described above, may be constituted by installing a program for executing the processing described above from a storage medium (e.g., a flexible disc or a compact disc read only memory (CD-ROM)) storing the program to a general purpose computer.

And, the means to supply the program is arbitrary. The program may be supplied via, for example, a communication line, a communication network, or a communication system, besides the predetermined storage medium as described above. In this case, the program is uploaded on, for example, a bulletin board system (BBS) of a communication network, and provided in superposition on a carrier wave via a network. Then, the thus-provided program is started and executed similarly to other application programs under a control of an operating system (OS), so that the above-described processing is performed.

The present disclosure is useful for a heat treatment system.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment system for forming an impurity-doped thin film on a workpiece by a doping processing that dopes an impurity on a thin film formed on the workpiece and a diffusion processing that diffuses the impurity doped on the thin film, the system comprising:
   a heat treatment condition storing unit configured to store a heat treatment condition with respect to the doping processing and the diffusion processing;
   a model storing unit configured to store a model that represents a relationship between a change of the heat treatment condition stored in the heat treatment condition storing unit and a change of an impurity concentration in the impurity-doped thin film;
   a heat treatment unit configured to form the impurity-doped thin film under the heat treatment condition stored by the heat treatment condition storing unit;
   a calculating unit configured to determine whether the impurity concentration in the impurity-doped thin film formed by the heat treatment unit is included within a predetermined range, and when it is determined that the impurity concentration is not included within the predetermined range, calculate a heat treatment condition of the doping processing and the diffusion processing that causes the impurity concentration in the impurity-doped film to be included within the predetermined range, based on the impurity concentration in the impurity-doped thin film and the model stored by the model storing unit; and
   an adjusting unit configured to change the heat treatment condition stored by the heat treatment storing unit to the heat treatment condition calculated by the calculating unit, and perform the doping processing and the diffusion processing under the changed heat treatment condition, thereby adjusting the impurity concentration in the impurity-doped thin film to be included within the predetermined range.

2. The heat treatment system of claim 1, further comprising:
   a heating unit configured to heat an inside of a processing chamber that accommodates a plurality of workpiece formed with the thin film;
   a plurality of gas supplying units each configured to supply a doping gas into the processing chamber; and
   a pressure controlling unit configured to control a pressure in the processing chamber,
   wherein the model storing unit is configured to store a model that represents a relationship between changes of a temperature in the processing chamber heated by the heating unit in the doping processing, a pressure in the processing chamber controlled by the pressure controlling unit, a flow rate of the doping gas supplied by the gas supplying unit, a time period of the doping processing, a temperature in the processing chamber heated by the heating unit in the diffusion processing, and a time period of the diffusion processing, and the change of the impurity concentration in the impurity-doped thin film, and
   the calculating unit is configured to calculate a temperature in the processing chamber heated by the heating unit in the doping processing, a pressure in the processing chamber controlled by the pressure controlling unit, a flow rate of the doping gas supplied by the gas supplying unit, a time period of the doping processing, a temperature in the processing chamber heated by the heating unit in the diffusion processing, and a time period of the diffusion processing, which cause the impurity concentration in the impurity-doped film to be included within the predetermined range.

3. The heat treatment system of claim 2, wherein the processing chamber is divided into a plurality of zones,
the model stored in the model storing unit represents a relationship between changes of a temperature in the processing chamber and a flow rate of the doping gas for each of the zones and a change of an impurity concentration in the impurity-doped thin film for each of the zones,
the heating unit sets a temperature for each of the zones in the processing chamber, and
the gas supplying unit sets a flow rate for each of the zones in the processing chamber.

4. The heat treatment system of claim 1, wherein the model stored in the model storing unit is a model that represents a relationship between a change of the impurity concentration for each depth of the thin film and a change of the heat treatment condition.

5. A heat treatment method for forming an impurity-doped thin film on a workpiece by a doping processing that dopes an impurity on a thin film formed on the workpiece and a diffusion processing that diffuses the impurity-doped on the thin film, the method comprising:
storing a heat treatment condition with respect to the doping processing and the diffusion processing;
storing a model that represents a relationship between a change of the heat treatment condition stored in the heat treatment condition storing unit and a change of an impurity concentration in the impurity-doped thin film;
forming the impurity-doped thin film under the heat treatment condition stored by the heat treatment condition storing unit;
determining whether the impurity concentration in the impurity-doped thin film formed by the heat treatment unit is included within a predetermined range, and when it is determined that the impurity concentration is not included within the predetermined range, calculating a heat treatment condition of the doping processing and the diffusion processing that causes the impurity concentration in the impurity-doped film to be included within the predetermined range, based on the impurity concentration in the impurity-doped thin film and the model stored by the model storing unit; and
adjusting the impurity concentration in the impurity-doped thin film to be included within the predetermined range by changing the heat treatment condition stored by the heat treatment storing unit to the heat treatment condition calculated by the calculating unit and performing the doping processing and the diffusion processing under the changed heat treatment condition.

6. A non-transitory computer-readable storage medium that stores a program for forming an impurity-doped thin film on a workpiece by a doping processing that dopes an impurity on a thin film formed on the workpiece and a diffusion processing that diffuses the impurity-doped on the thin film, which, when executed, causes a computer to function as:
a heat treatment condition storing unit configured to store a heat treatment condition with respect to the doping processing and the diffusion processing;
a model storing unit configured to store a model that represents a relationship between a change of the heat treatment condition stored in the heat treatment condition storing unit and a change of an impurity concentration in the impurity-doped thin film;
a heat treatment unit configured to form the impurity-doped thin film under the heat treatment condition stored by the heat treatment condition storing unit;
a calculating unit configured to determine whether the impurity concentration in the impurity-doped thin film formed by the heat treatment unit is included within a predetermined range, and when it is determined that the impurity concentration is not included within the predetermined range, calculate a heat treatment condition of the doping processing and the diffusion processing that causes the impurity concentration in the impurity doped-thin film to be included within the predetermined range, based on the impurity concentration in the impurity-doped thin film and the model stored by the model storing unit; and
an adjusting unit configured to change the heat treatment condition stored by the heat treatment storing unit to the heat treatment condition calculated by the calculating unit, and perform the doping processing and the diffusion processing under the changed heat treatment condition, thereby adjusting the impurity concentration in the impurity-doped thin film to be included within the predetermined range.

\* \* \* \* \*